(12) United States Patent
Fontaine et al.

(10) Patent No.: US 9,831,637 B1
(45) Date of Patent: Nov. 28, 2017

(54) OPTICAL MODULATOR WITH VERTICAL-CAVITY SURFACE-EMITTING LASERS

(71) Applicant: Alcatel-Lucent USA Inc., Murray Hill, NJ (US)

(72) Inventors: Nicolas K. Fontaine, Keyport, NJ (US); Haoshuo Chen, Aberdeen, NJ (US); David Thomas Neilson, Old Bridge, NJ (US); Roland Ryf, Aberdeen, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 15/378,976

(22) Filed: Dec. 14, 2016

Related U.S. Application Data

(60) Provisional application No. 62/396,219, filed on Sep. 18, 2016.

(51) Int. Cl.
*H01S 5/00* (2006.01)
*H01S 5/40* (2006.01)
*H01S 5/42* (2006.01)
*H01S 5/042* (2006.01)
*H01S 5/065* (2006.01)

(52) U.S. Cl.
CPC .......... *H01S 5/4012* (2013.01); *H01S 5/0427* (2013.01); *H01S 5/0656* (2013.01); *H01S 5/4006* (2013.01); *H01S 5/4025* (2013.01); *H01S 5/423* (2013.01)

(58) Field of Classification Search
CPC .... H01S 5/4006; H01S 5/4025; H01S 5/0656; H01S 5/0427; H01S 5/423; H01S 5/4012
See application file for complete search history.

(56) References Cited

U.S. PATENT DOCUMENTS

| | | | |
|---|---|---|---|
| 2001/0014106 A1* | 8/2001 | Gevorgian | H01S 5/4068 372/20 |
| 2006/0215714 A1* | 9/2006 | Luo | H01S 3/10092 372/29.02 |
| 2009/0074019 A1* | 3/2009 | Wong | H01S 5/183 372/26 |
| 2011/0052114 A1* | 3/2011 | Bernasconi | H01S 5/026 385/3 |

OTHER PUBLICATIONS

Tatum, Jim A. et al., "VCSEL-Based Interconnects for Current and Future Data Centers", Journal of Lightwave Technology, vol. 33, No. 4, Feb. 15, 2015, pp. 727-732.

(Continued)

*Primary Examiner* — Kinam Park
(74) *Attorney, Agent, or Firm* — John F. McCabe

(57) ABSTRACT

An apparatus includes a plurality of VCSELs, a master laser, one or more electrical drivers, and an optical combiner. The master laser is configured to transmit laser light to the VCSELs to optically lock wavelengths of the VCSELs. The one or more electrical drivers are connected to directly electrically modulate the VCSELs in a manner responsive to one or more digital data stream. The optical combiner is configured to combine light received from, at least, a pair of the VCSELs into an optical carrier with a substantially phase digital data modulation.

15 Claims, 7 Drawing Sheets

(56) References Cited

OTHER PUBLICATIONS

Xie, Chongjin et al., 400-Gb/s PDM-4PAM WDM System Using a Monolithic 2x4 VCSEL Array and Coherent Detection, Journal of Lightwave Technology, vol. 33, No. 3, Feb. 1, 2015, pp. 670-677.
Bhooplapur, Sharad P. et al., "Characterization of the Phase and Amplitude Modulation of Injection-Locked VCSELs at 1550 nm Using Coherent Optical Demodulation", IEEE Journal of Selected Topics in Quantum Electronics, vol. 19, No. 6, Nov.-Dec. 2013, 1702408 (8 pgs).
Lau, Erwin K. et al., "Strong optical injection-locked semiconductor lasers demonstrating > 100-GHz resonance frequencies and 80-GHz intrinsic bandwidths", Optics Express, vol. 16, No. 9, Apr. 28, 2008, pp. 6609-6618.
Orenstein, M. et al., "Two-dimensional phase-locked arrays of vertical-cavity semiconductor lasers by mirror reflectivity modulation", Appl. Phys. Lett, 58 (8), Feb. 25, 1991, pp. 804-806.
Shau, Robert et al., "Long-wavelength InP-based VCSELs with Buried Tunnel Junction: Properties and Applications", Proceedings of SPIE, vol. 5364, 2004, Downloaded from http://proceedings.spiedigitallibrary.org/, pp. 1-15.
Parekh, Devang et al., "Greatly enhanced modulation response of injection-locked multimode VCSELs", Optics Express, vol. 16, No. 26, Dec. 22, 2008, pp. 21582-21586.

\* cited by examiner

10

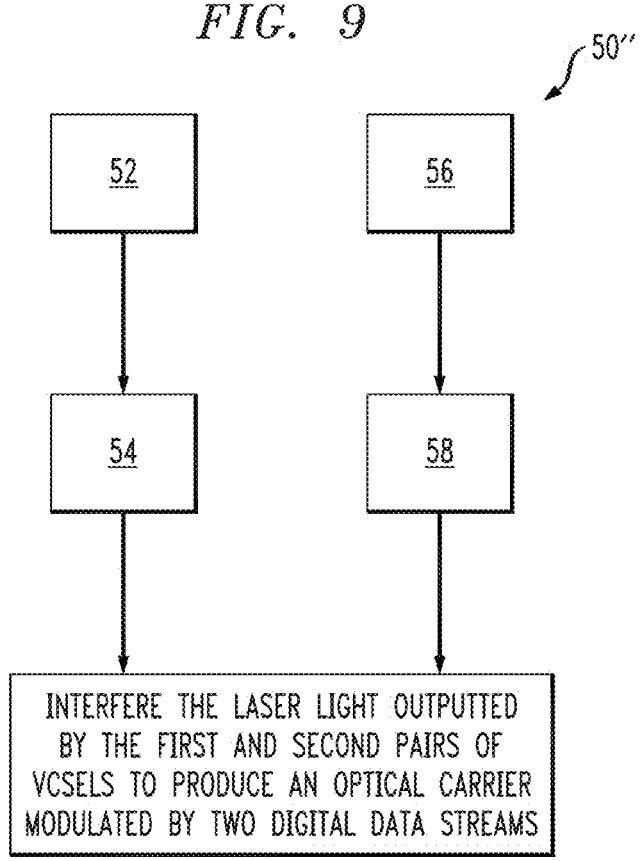

OPTICAL MODULATOR WITH VERTICAL-CAVITY SURFACE-EMITTING LASERS

This application claims the benefit of U.S. provisional patent application No. 62/396,219, filed Sep. 18, 2016 by Nicolas K. Fontaine, David T. Neilson, and Roland Ryf.

BACKGROUND

Technical Field

The inventions relate to optical modulators and optical transmitters and methods for using optical modulators and optical transmitters.

Discussion of the Related Art

This section introduces aspects that may be helpful to facilitating a better understanding of the inventions. Accordingly, the statements of this section are to be read in this light and are not to be understood as admissions about what is in the prior art or what is not in the prior art.

Short-reach optical communications have used vertical-cavity surface-emitting lasers (VCSELs), which were directly modulated. For example, VCSELs may be used for optical communications networks inside data centers. For short reach applications, VCSELs can provide advantages of being inexpensive, small, easy to package, and usable with low drive Typically, long-haul optical communication has used narrow line-width lasers and external optical modulators. In coherent optical communications, the external optical modulator may be an optical in-phase/quadrature-phase (I/Q) modulator with multiple optical phase modulators and/or amplitude modulators in a multi-arm interferometer. One such multi-arm interferometer is a nested Mach-Zehnder interferometer. Typically, for use as a digital data modulator, a Mach-Zehnder interferometer (MZIs) is constructed in lithium niobate, silicon, or group III-V semiconductor. Such MZIs typically produce low optical loss and low chirp of the optical carrier. Nevertheless, for phase modulation at high symbol rates, a MZI typically includes traveling wave modulation electrodes that are operates at large RF drive voltages (e.g., greater than 1 volt). Thus, in coherent optical communications, MZIs are typically large structures.

Typically, in long-haul communications, VCSELs are not used, because VCSELs usually have large line-widths, are often multimode, and may produce optical pulses with strong frequency chirp. Nevertheless, single-mode VCSELs have been used in coherent optical communication over distances of up to 960 kilometers when an optical receiver included a digital signal processor (DSP) configured to correct chromatic dispersion and polarization mode dispersion.

BRIEF SUMMARY

Various embodiments include a plurality of vertical-cavity surface-emitting lasers (VCSELs) injection locked to a master laser and directly electrically modulated to provide a substantially phase modulated optical carrier. In some such embodiments, the driving voltages of the VCSELs may be low, and/or the electrical drivers may not include traveling wave electrodes. For these reason, electrical operating structures may be compact in some such optical data modulators when compared with optical data modulators based on Mach-Zehnder interferometers (MZIs).

An apparatus includes a plurality of VCSELs, a master laser, one or more electrical drivers, and an optical combiner. The master laser is configured to transmit laser light to the VCSELs to optically lock wavelengths of the VCSELs. The one or more electrical drivers are connected to directly electrically modulate the VCSELs in a manner responsive to one or more digital data stream. The optical combiner is configured to combine light received from, at least, a pair of the VCSELs into an optical carrier with a substantially phase digital data modulation.

In any embodiments of the above apparatus, one of the one or more electrical drivers may be connected to operate one pair of the VCSELs in a push-pull configuration. In some such embodiments, the optical combiner may be connected to combine light received from a second pair of different ones of the VCSELs into another optical carrier with a substantially phase digital data modulation.

In any embodiments of the above apparatus, another of the one or more drivers may be connected to operate a separate second pair of the VCSELs in a push-pull configuration. In some such embodiments, the one or more electrical drivers may be configured to directly electrically modulate the VCSELs such that the optical combiner combines light from the plurality of VCSELs into an optical carrier with in-phase and quadrature-phase digital modulations. In some such embodiments, the digital data modulations may comprise modulations of an entire quadrature amplitude modulation constellation.

In any embodiments of the above apparatus, the optical combiner may include a free space optical device with a pixilated surface configured or configurable to split a light beam received from the master laser into multiple light beams.

In any embodiments of the above apparatus, the optical combiner may include a waveguide optical coupler configured to combine light from a first pair of the VCSELS and a disjoint second pair of the VCSELs with a relative phase shift.

A method includes outputting laser light from a pair of directly electrically modulated vertical-cavity surface-emitting lasers (VCSELs) and optically interfering the outputted laser light. The outputted laser light is produced while the VCSELs are injection locked to a single master laser. The optically interfering includes interfering the outputted laser light to produce an optical carrier having a phase data modulation.

In some embodiments of the above method, the directly electrically modulating of VCSELs may be performed in a push-pull manner In any embodiments of the above methods, the laser light outputted by the pair of vertical-cavity surface-emitting lasers may be mutually coherent.

In any embodiments of the above method, the optically interfering may produce the optical carrier with a substantially binary-phase-shift-keying modulation. In any embodiments, the above method may further include outputting second laser light from a pair of different directly electrically modulated vertical-cavity surface-emitting lasers and optically interfering the outputted second laser light. The outputting second laser light is produced while the different directly electrically modulated vertical-cavity surface-emitting lasers are injection locked to the single master laser. The optically interfering of the second laser light produces another optical carrier having a phase data modulation. In some such embodiments, the above methods may include interfering the outputted laser light from the pairs produces an optical carrier with in-phase and quadrature-phase data modulations. In some such embodiments the interfering of the outputted laser light from the pairs produces an optical carrier with a quadrature amplitude data modulation.

BRIEF DESCRIPTION OF THE DRAWINGS

FIG. 9 is a flow chart illustrating a specific embodiment of the method of FIG. 7 that produces an optical carrier with in-phase and quadrature-phase modulation, e.g., for use in the optical data modulators of FIGS. 1, 3, and 5.

In the Figures and text, like reference symbols indicate elements with similar or the same function and/or similar or the same structure.

In the Figures, relative dimension(s) of some feature(s) may be exaggerated to more clearly illustrate the feature(s) and/or relation(s) to other feature(s) therein.

Herein, various embodiments are described more fully by the Figures and the Detailed Description of Illustrative Embodiments. Nevertheless, the inventions may be embodied in various forms and are not limited to the embodiments described in the Figures and the Detailed Description of Illustrative Embodiments.

DETAILED DESCRIPTION OF ILLUSTRATIVE EMBODIMENTS

Various embodiments include VCSELs that are injection locked to the same master laser. Such injection locked VCSELs may have narrow optical line-widths, e.g., about equal to the line-width of the master laser. In such embodiments, the VCSELs may be directly electrically modulated to produce phase data modulation, and the driving voltages for the direct electrical modulation may be low, e.g., less than 1 volt.

In various embodiments, the VCSELs may be formed as regular or irregular one-dimensional or two-dimensional arrays on a common planar substrate or on different substrates, e.g., semiconductor substrate(s).

Herein, the various optical data modulators may include an integrated optical coupler, e.g., a planar optical waveguide interferometer, and/or may include a free space optical coupler.

Figure 1:
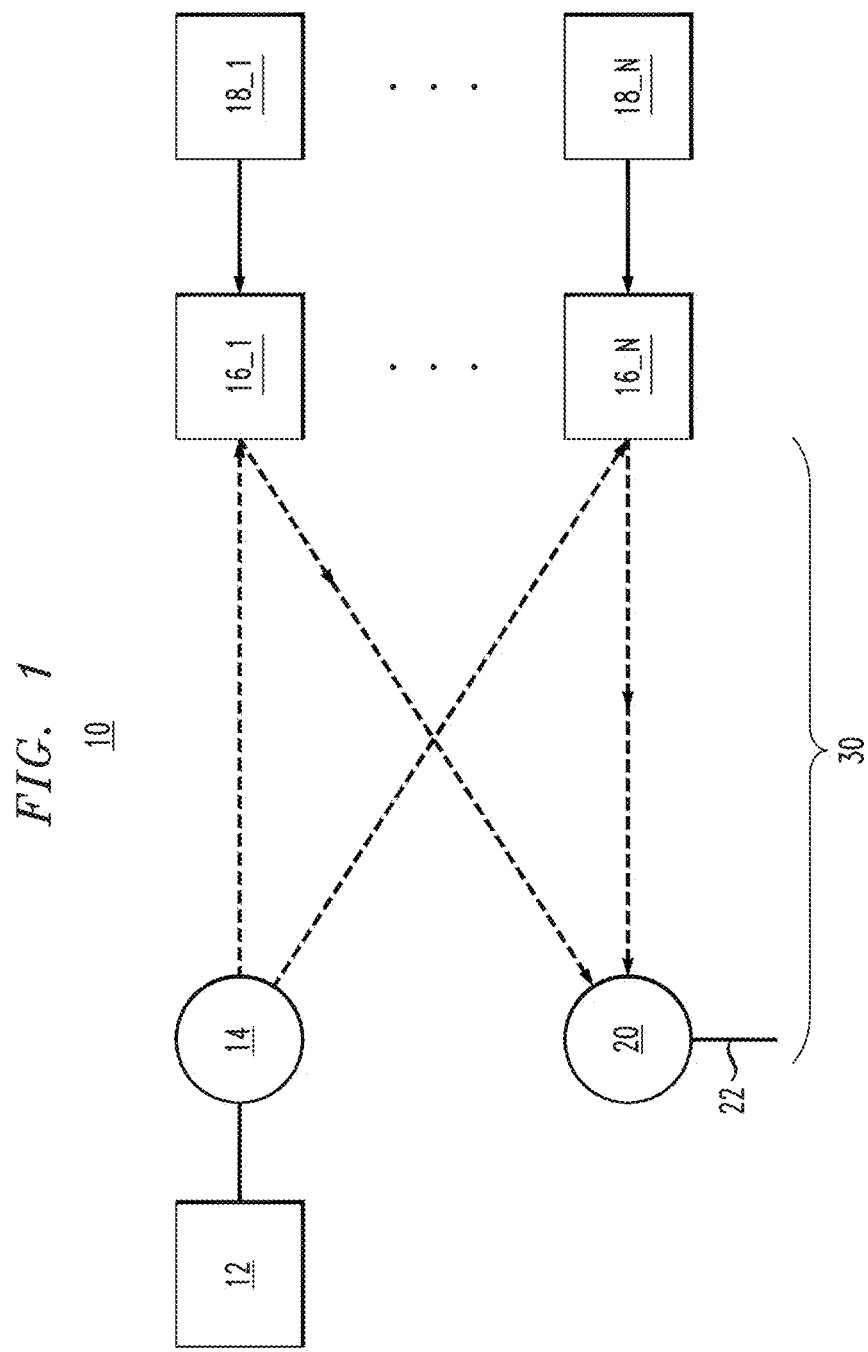
FIG. 1 schematically illustrates an optical data modulator based on two or more vertical-cavity surface-emitting lasers (VCSELs)

FIG. 1 schematically illustrates an embodiment of an optical data modulator 10 for producing an optical carrier with a data-carrying phase modulation. The optical data modulator 10 includes a master laser 12, an array of N VCSELs 16_1 . . . 16_N, an array of N electronic drivers 18_1 . . . 18_N, and an optical coupler 30. The optical coupler 30 includes a 1×N optical splitter and an N×1 optical combiner 20. Here, N is an integer equal to or greater than 2, e.g., N may be 2, 3, 4, 5, 6, etc.

The master laser 12 transmits light into the optical input of 1×N optical splitter 14. In some embodiments, the master laser 12 may be coupled to the optical input of the 1×N optical splitter 14 via an optical isolator (not shown) to protect the master laser 12 from external optical feedback. The master laser 12 may be, e.g., a conventional laser that produces continuous-wave light with a narrow line-width.

The 1×N optical splitter 14 is configured to direct the light received from its optical input to each of its N optical outputs. The 1×N optical splitter 14 may be a conventional optical power splitter that transmits equal or unequal portions of the received optical power received to its N optical outputs. The 1×N optical splitter 14 delivers light to its N optical output ports with a selected or fixed set of relative phases.

Each of the N VCSELs 16_1-16_N receives light of the master laser 12 from a corresponding one of N optical outputs of the 1×N optical splitter 14. Thus, the light from the master laser 12 is injected into each of the N individual VCSELs 16_1-16_N, e.g., via the surface optical outputs of the VCSELs 16_1-16_N. The light of the master laser 12 is injected at a power level sufficiently high to lock the lasing wavelengths of the N individual VCSELs 16_1-16_N to the center wavelength of the master laser 12.

The N VCSELs 16_1-16_N may be conventional VCSELs, e.g., multi-mode or single-mode VCSELs formed on a single planar substrate or multiple planar substrates. The N VCSELs 16_1-16_N may be formed in various geometric patterns, e.g., a one-dimensional or two-dimensional array, or in an irregular pattern along the surface(s) of one or more substrates. While the simplest optical phase modulator 10 has two of the VCSELs 16_1-16_N, an I/Q optical data modulator may have four or more of the VCSELs 16_1-16_N. In various embodiments, the optical data modulator 10 may have different numbers of the VCSELs 16_1-16_N, e.g., even an odd number.

Each electronic driver 18_1 . . . 18_N is a digital-to-analog converter configured to directly electrically pump a corresponding one of the VCSELs 18_1-18_N. During operation, the electronic drivers 18_1-18_N are typically configured to maintain the VCSELs 16_1-16_N in lasing states. Each electronic driver 18_1 . . . 18_N directly modulates the corresponding one of the VCSELs 16_1-16_N in a manner responsive to receipt therein of a digital data stream.

In some embodiments, a pair of the electronic drivers 18_1-18_N may be combined into a single electronic unit that is configured to directly modulate a corresponding pair of the VCSELs 16_1-16_N with complementary voltages. For binary data, the complementary voltage for one binary data value has the same value as the voltage driving the other VCSEL of the same pair for the other binary data value, i.e., a push-pull driving configuration.

Herein, we may also refer to a pair of electronic drivers driving a pair of VCSELs responsive the same received digital data stream as an electronic driver.

The N×1 optical combiner 20 is configured to optically interfere light received at the N optical inputs thereof. Each optical input of the N×1 optical combiner 20 receives light from a corresponding one of the N VCSELs 16_1-16_N. The N×1 optical combiner 20 interferes the light from its different optical inputs with a set of selected or fixed relative phase differences. In particular, the N×1 optical combiner causes light received from the N VCSELs 16_1-16_N to be interfered in the optical output 28 of the optical data modulator 10 with this set of effective fixed relative phase differences.

The fixing of relative phase differences for the light of the master laser 12 injected into the N individual VCSELs 16_1-16_N and for interfering the light from the N individual VCSELs 1-16_N in the optical output 28 defines the modulation constellation produced by the optical data modulator 10. By appropriately fixing these relative phases, the modulation constellation may be, e.g., a binary phase shift keying (BPSK) constellation, a quadrature phase shift keying (QPSK) constellation, a 8, 16, 32, 64, or 256 quadrature amplitude modulation (QAM) constellation, or even a higher QAM constellation.

The selection of the modulation constellation of the optical data modulator 10 also involves appropriately fixing the electrical drive voltages for the N VCSELs 16_1-16_N. To produce large enough phase differences between optical signals emitted by an individual one of the VCSELs 16_1-16_N for different received binary data values, the one of the VCSELs 16_1-16_N can be DC driven to have a resonant wavelength slightly shifted from the wavelength of the master laser 12. For example, a shift of about a nanometer or less may be sufficient at wavelengths in the optical telecommunication C-band or L-band. In light of this description, the person of ordinary skill in the relevant arts would be able to easily determine suitable manners to DC and AC electrically drive the VCSELs 16_1-16_N to emit optical signal values with suitable phase differences.

Figure 2:
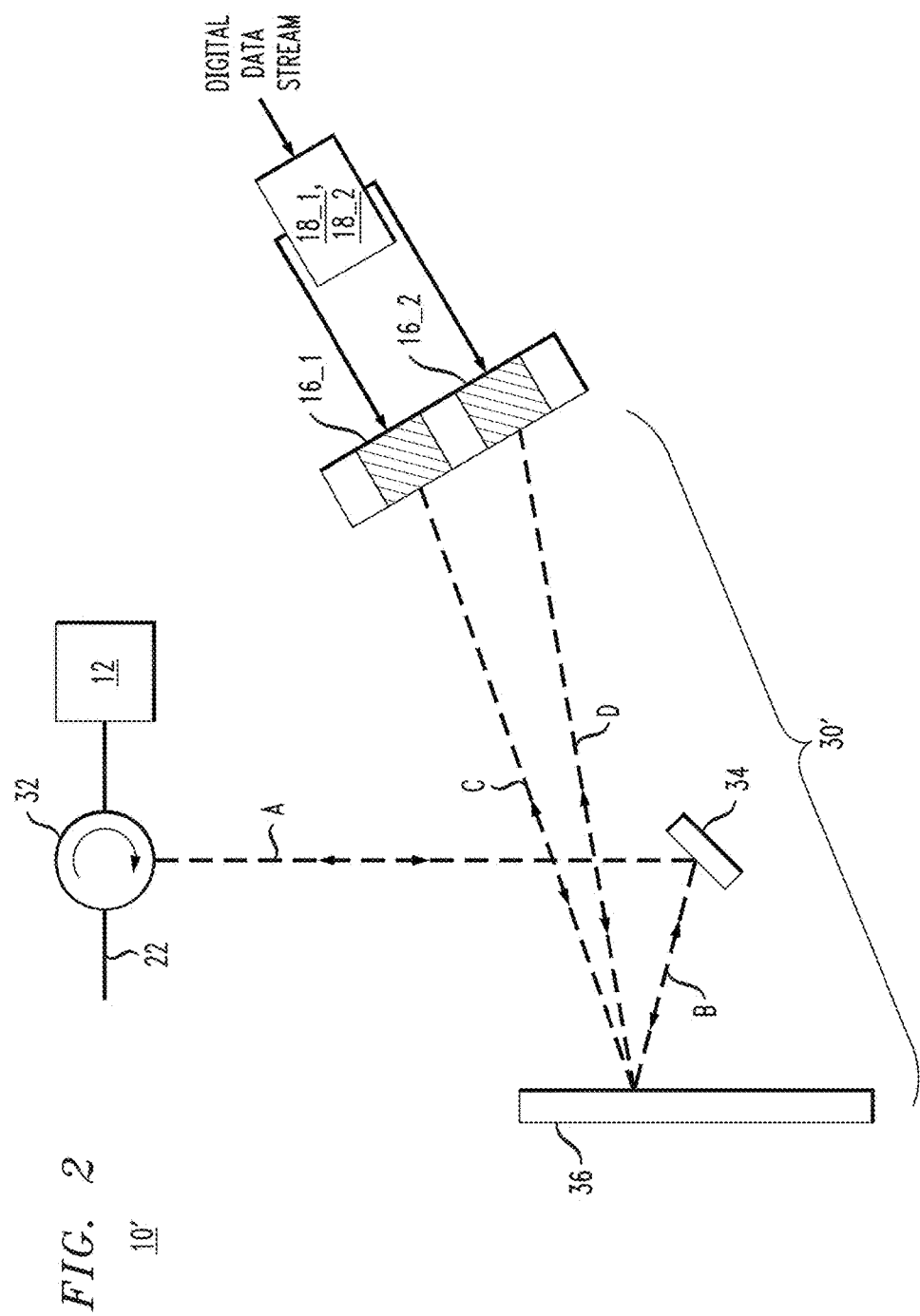
FIG. 2 schematically illustrates a push-pull embodiment of the optical phase modulator of FIG. 1, which has a free space optical coupler and two of the VCSELs.
Figure 3:
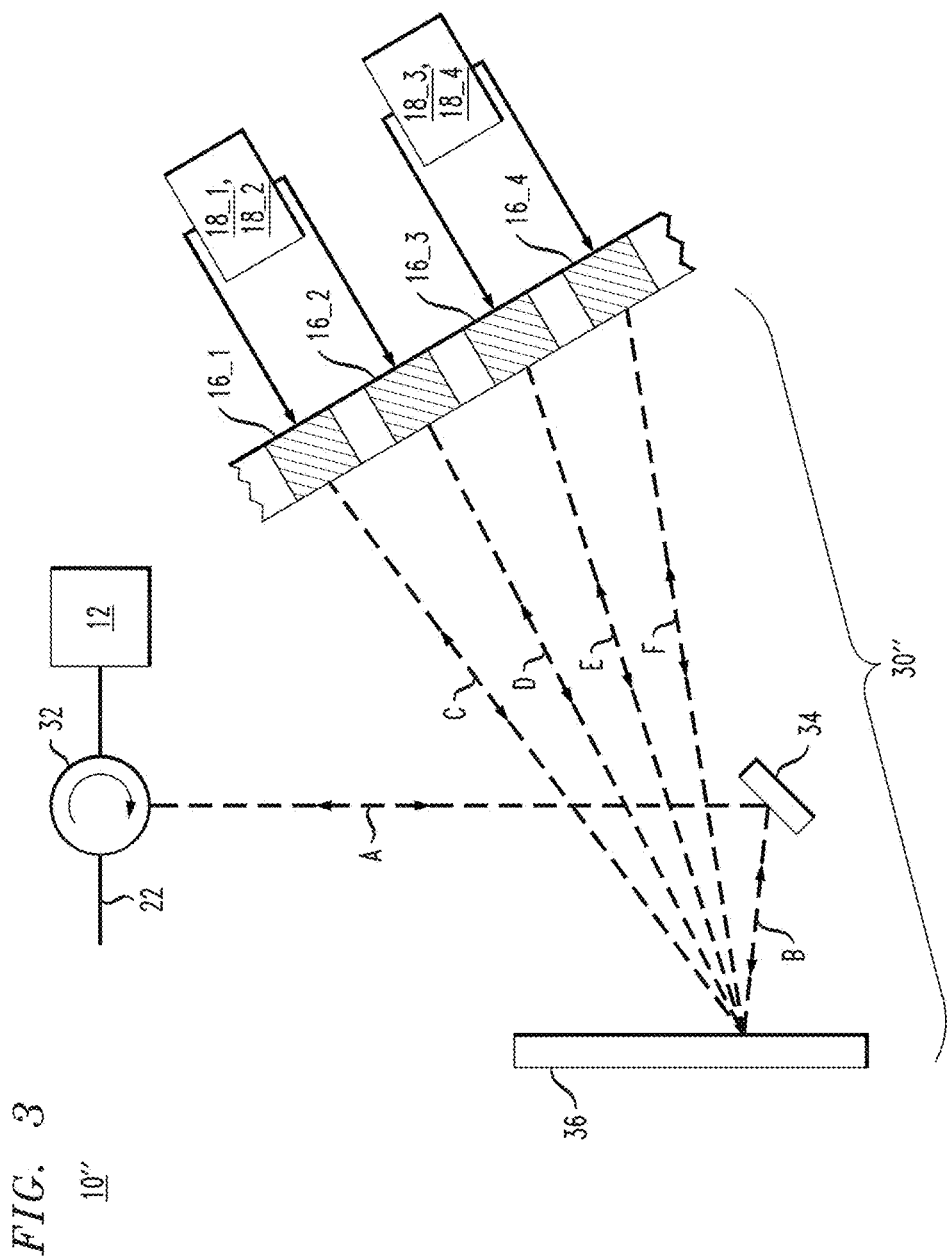
FIG. 3 schematically illustrates an in-phase/quadrature-phase (I/Q) embodiment of the optical data modulator of FIG. 1, which has a free space optical coupler and four VCSELs.

FIGS. 2-3 illustrate embodiments 10', 10" of the optical data modulator 10 of FIG. 1 in which free-space optical device(s) are included in the optical coupler 30 of FIG. 1. The optical couplers 30', 30" include an optical circulator 32, a mirror 34, and a spatial light modulator (SLM) 36, i.e., a free space optical device. The optical couplers 30', " may also include conventional optical lens(es) (not shown) between the optical mirror 34 and the SLM 36, between the optical mirror 34 and the optical circulator 32, and/or in front of surface optical outputs of the VCSELs 16_1, 16_2. Such lens(es) can enable optical beams B, C, and D to couple to multiple pixels of the SLM 36 and/or focus or expand optical beams as suitable. The SLM 36 is incorporated into both the 1×N optical splitter 14 and N×1 optical combiner 20 of FIG. 1.

The optical data modulator 10' can provide a push-pull embodiment of the optical data modulator 10 of FIG. 1. In some embodiments, the optical data modulator 10' modulates data onto an optical carrier according to a BPSK constellation.

FIG. 2 illustrates optical beams A, B, C, and D via dashed lines along which light from the master laser 12 and light from the two VCSELs 16_1, 16_2 propagate in opposite directions. In particular, the injection light of the master laser 12 propagates downward along beam A, to the left along beam B, and to the right along beams C and D. Below, a description of the light beams A-D is provided to explain the operation of the optical coupler 30'.

In the optical coupler 30, the optical circulator 32 redirects injection light received from the master laser into optical beam A, which is redirected via the mirror 34 to the SLM 36 via optical beam B. The SLM 36 splits the optical beam B into the two optical beams C and D in which light has a fixed zero or nonzero relative phase difference.

The SLM 36 may be a phase mask with one or more optical gratings thereon, an array of reconfigurable micro-electro-mechanical system (MEMS) mirrors, or a reconfigurable liquid crystal on semiconductor device with an array of pixels with reconfigurable refractive indices.

In one embodiment, the SLM 36 is an array of MEMS mirrors, wherein the MEMS mirrors are separately controllable to perform tilt and translate movements. In such an embodiment, the optical beam B is expanded, e.g., by one or more lenses, to illuminate separate first and second groups of the MEMS mirrors. The MEMS mirrors of the first and second groups are tilted at different angles so that the first group directs light from a lateral spatial part of the optical beam B to the VCSEL 16_1 via optical beam C, and the second group directs light from a different lateral spatial part of the optical beam B to the VCSEL 16_2 via optical beam D. In addition, the MEMS mirrors of the first and second groups may be relatively translated, e.g., perpendicular to the surface of the SLM 36, to introduce a relative phase shift between the light injected into the two VCSELs 16_1, 16_2. Such a relative phase shift in the injection light can cause a relative phase shift in the light emitted by the two VCSELs 16_1, 16_2. Similarly, the tilts of the mirrors of the first and second groups will cause VCSEL light, received at the SLM 36 from the optical beams C and D, to be combined into the optical beam B. Also, relative translations of the mirror(s) of first and second groups on the SLM 26 can introduce relative phase shifts received from the two VCSELs 16_1, 16_2.

In other embodiments, the SLM 36 may be, e.g., a liquid crystal on semiconductor (LCOS) array. In such an LCOS array, first and second groups of separately operable LCOS pixels replace the respective first and second groups of MEMS mirrors of the above described embodiment of the SLM 36. Then, each group of LCOS pixels may be configured to form a linear grating of refractive index values that redirects light from a lateral spatial portion the optical beam B into one of the optical beams C and D. In addition, the location of such linear grating(s) may be moved along the surface of the SLM 36 to produce a relative phase difference between light directed from the optical beam B into the optical beam C and light directed from the optical beam B into the optical beam D. Similarly, such configurations of the first and second groups of LCOS pixels will redirect VCSEL light from the optical beams C and D into the optical beam B and may also produce an additional relative phase shift between said light in the optical beam B.

The person of ordinary skill in the relevant arts would also understand that the SLM 36 could also be formed of a fixed spatial pattern of regions of varying optical reflectivity or varying refractive index, e.g., an optical phase grating.

In light of the above description, one of ordinary skill in the relevant arts would understand how to make and use an embodiment of the optical modulator 10' in which the SLM 36 is formed by a transmissive phase grating or a pixilated reconfigurable LCOS array.

Figure 4:
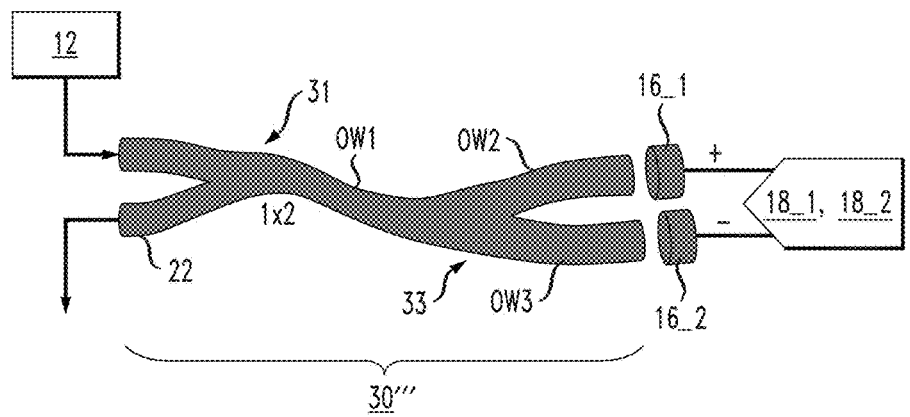
FIG. 4 schematically illustrates a push-pull embodiment of the optical data modulator of FIG. 1, which has an optical waveguide coupler and two VCSELs.
Figure 5:
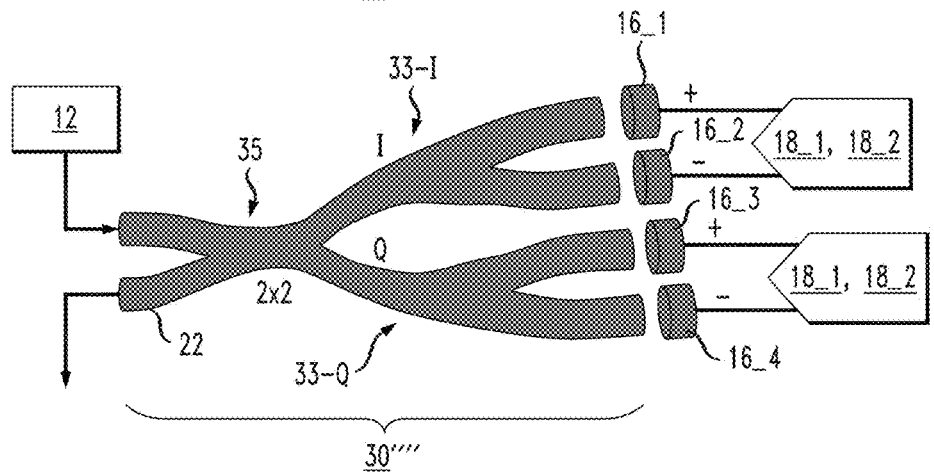
FIG. 5 schematically illustrates an I/Q embodiment of the optical data modulator of FIG. 1, which incorporates an optical waveguide coupler and four VCSELs.
Figure 6:
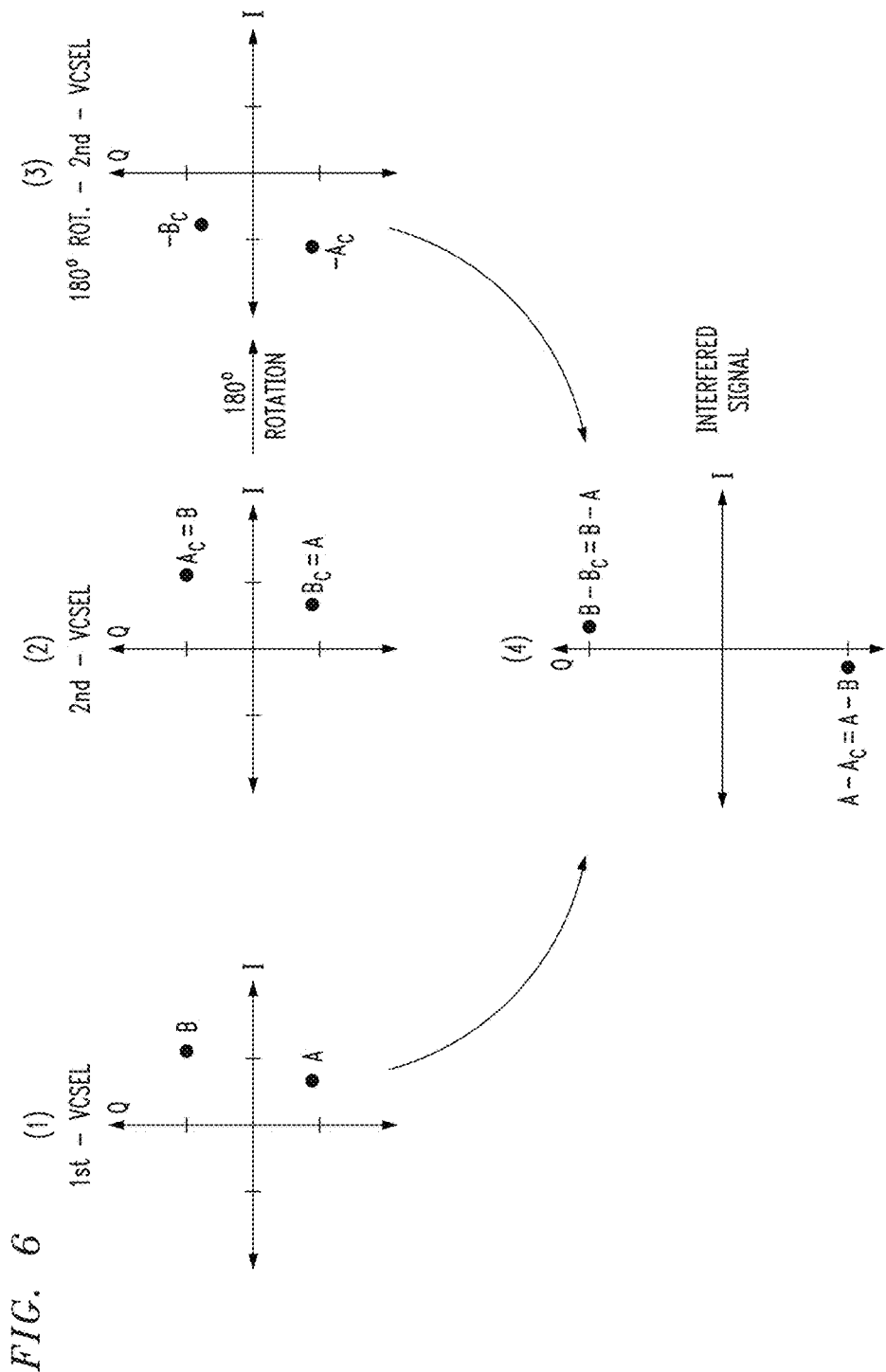
FIG. 6 schematically illustrates optical signals in an optical modulator having a pair of VCSELs is push-pull operated to produce a data-modulated optical carrier.

FIG. 6 illustrates one embodiment for push-pull operation of a pair of VCSELs, e.g., the VCSELs 16_1, 16_2, 16_N of FIGS. 1-5. In these embodiment, the VCSELs typically may have approximately the same operating characteristics.

In push-pull operation, each VCSEL is driven at one voltage to emit light for a first binary data value and is driven at a different second voltage to emit light for the different second binary data value. Typically, a VCSEL is configured to emit light with one phase for the first binary data value and to emit light with another phase for the second binary data value. For push-pull operation, each VCSEL may be driven, e.g., by the electronic drivers 18_1, 18_2, 18_N of FIGS. 1-5.

Parts 1 and 2 of FIG. 6 schematically illustrate example complex values of optical signals emitted by the VCSELs of the corresponding pair during push-pull operation.

Part (1) schematically illustrates example complex values A and B for the optical field emitted by the first VCSEL of the pair in response to being electrically driven to emit light for the respective first and the second binary data values.

Part (2) illustrates the complex values $A_c$ and $B_c$ of the optical signals emitted by the second VCSEL in response to being electrically driven to emit light for the same respective first and second binary data values. Since the second VCSEL is electrically driven by a voltage complementary to the voltage driving the first VCSEL of the same pair, $A_c$=B and $B_c$=A. That is, for each binary data value, the second VCSEL emits the alternate optical signal of the pair (A, B) as emitted by the first VCSEL of the same pair.

Parts 3 and 4 of FIG. 6 functionally illustrate how a 1×2 optical coupler, e.g., in the optical couplers 30, 30', 30", 30'", 30"" of FIGS. 1-5, "effectively" interferes the optical signals emitted from the first and second VCSELs during push-pull operation. The 1×2 optical coupler interferes optical signals from the first and second VCSELs with a relative phase difference that would produce a combined optical signal of low or zero magnitude if the two VCSELs were electrically driven with the same voltages rather than in push-pull mode. Thus, the 1×2 optical coupler may interfere the light of the two VCSELs with an "effective" fixed, relative phase difference of about 180 degrees, e.g., up to an error of ±5°, ±2°, or even ±1° or less.

Part 3 illustrates how of an effective 180 degree phase delay would transform the complex signal values from the second VCSEL, i.e., the VCSEL driven by complementary voltages during push-pull operation. The complex signal values $A_c$ and $B_c$ are transformed to $-A_c$ and $-B_c$, respectively.

Part 4 schematically illustrates the combined optical signals obtained by interfering the optical signals of part 4 with the optical signals of part 1, i.e., output optical signals of the push-pull operated, optical data modulator. Up to an overall phase, interference of the optical signals output by the VCSELs, as described above, would produce optical signals having the complex signal values $(A-A_c)$ and $(B-B_c)$ for the respective first and second binary data values. The combined optical signals, i.e., $(A-A_c)$ and $(B-B_c)$, result when light of the VCELS is interfered with an effective 180 degree phase difference as already described. The optical signals $(A-A_c)$ and $(B-B_c)$ have about equal amplitude and opposite phase. These optical signals belong to a BPSK constellation.

FIG. 3 illustrates an in-phase/quadrature-phase (I/Q) embodiment 10" of the optical data modulator 10 of FIG. 1. The I/Q optical data modulator 10" is capable of producing phase modulation according to the QPSK constellation and/or various QAM constellations. The I/Q optical modulator 10" includes four VCSELs 16_1, 16_2, 16_3, 16_4 and an optical coupler 30", which combines the optical splitter 14 and optical combiner 20 of FIG. 1.

The optical coupler 30" is a free-space optical device that includes an optical circulator 32, a mirror 34, and a SLM 36. The optical coupler 30" may also include one or more optical lenses (not shown) between the optical mirror 34 and the SLM 36, between the optical mirror 34 and the optical circulator 32, and/or in front of the VCSELs 16_1-16_4. For example, such lens(es) may enable optical beams B, D, E, and F to couple to multiple separately reconfigurable pixels of the SLM 36 and/or aid to focus or expand optical beams as convenient.

FIG. 3 illustrates the optical beams A, B, C, D, E, and F via dashed lines along which light from the master laser 12 and light from the VCSELs 16_1-16_4 propagate in opposite directions. In particular, the injection light of the master laser 12 propagates downward along beam A, to the left along beam B, and to the right along beams C-F. Below, a description of the light beams A-F is provided to explain the operation of the optical coupler 30".

In the optical coupler 30", the optical circulator 32 redirects injection light of the master laser 12 into optical beam A, which is redirected via the optical mirror 34 to the optical beam B. The SLM 36 splits the optical beam B into the four optical beams C, D, E, and F in which the mutually coherent light has fixed relative phase differences.

In one embodiment, the SLM 36 is an array of MEMS mirrors. In the array, the individual MEMS mirrors are able to perform both tilt and translation movements. In such an embodiment, the optical beam B may be expanded, e.g., by one or more lenses, to illuminate physically separated first, second, third, and fourth groups of MEMS mirrors of the array. The MEMS mirrors of the first, second, third, and fourth groups may be tilted at different angles to direct light from the optical beam B to the different VCSELs 16_1, 16_2, 16_3, and 16_4, via the respective optical beams C, D, E, and F. In addition, the MEMS mirrors of the first, second, third, and fourth groups may or may not be relatively translated, e.g., perpendicular to the surface of the array 36, to introduce fixed relative phase shifts between the injection light incident on the four VCSELs 16_1, 16_4. Such relative phase shifts in the injection light may cause an effective relative phase shift in the light emitted by the different VCSELs 16_1-16_4. Similarly, the tilts of the mirrors of the four groups on the array 36 will cause light received at the SLM 36 via the optical beams C, D, E, and F to be combined into the single optical beam B. Also, relative translations of the mirror(s) of four groups on the SLM 36 may introduce further relative phase shifts between the mutually coherent light, emitted by the four VCSELs 16_1-16_4, in the optical beam B.

The four VCSELs 16_1-16_4 function as two pairs, i.e., the VCSELs 16_1-16_2 form an I-pair and the VCSELs 16_3-16_4 form a Q-pair. For each of the I- and Q-pairs, the optical coupler 30" may be configured as described with respect to the single pair of the VCSELs 16_1-16_2 of FIG. 6. In particular, the two VCSELs 16_1-16_2 of the I-pair may be push-pull operated, as described for the pair of VCSELs in FIG. 6, and the two VCSELs 16_3-16_4 of the Q-pair may independently push-pull operated, as described for the pair of VCSELs in FIG. 6. Then, the I-pair and Q-pair emit light that produces optical carriers, which are BPSK modulated with the independent digital data streams that directly electrically modulate the VCSELs of these two pairs.

In the optical data modulator 10", the SLM 36 is also configured such that the light of the I-pair, i.e., the two VCSELs 16_1-16_2, is interfered, in the optical beam B, with an effective relative phase difference of about 90° or about 270° with respect to the light of the Q-pair, i.e., the two different VCSELs 16_3-16_4. For that reason, the two VCSELs 16_1-16_2 of the I-pair produce an in-phase modulated optical carrier and the two VCSELs 16_3-16_4 of the Q-pair produce a quadrature-phase modulated optical carrier. Thus, in the optical beams A and B, the light from the four VCSELs 16_1-16_4 is phase modulated to carry data on both the in-phase and the quadrature-phase.

FIGS. 4-5 illustrate embodiments 10''', 10'''' of the optical data modulator 10 of FIG. 1 in which a planar optical waveguide coupler 30''', 30'''' forms the optical coupler 30 of FIG. 1. The planar optical couplers 30''', 30'''' combine the optical splitter 14 and optical combiner 20 of FIG. 1.

The optical data modulator 10''' is a push-pull embodiment of the optical data modulator 10 of FIG. 1 and can output an optical carrier that is phase modulated according to a BPSK constellation.

The planar optical coupler 30''' includes a 2×1 planar optical coupler 31, a 1×2 planar optical coupler 33, and first, second, and third planar optical waveguides OW1, OW2, OW3. The first optical waveguide OW1 transports light of the master laser 12 from the 2×1 optical coupler 31 to the 1×2 planar optical coupler 33. The 1×2 planar optical coupler 33 sends portions of said received light to the second and third optical waveguides OW2, OW3. For example, the 1×2 planar optical coupler 33 may be a 50/50 optical power splitter with respect to light received from the master laser 12. Each of the second and the third planar optical waveguides OW2, OW3, transmits the received injection light to a corresponding one of the VCSELs 16_1, 16_2. The second and third optical waveguides OW2, OW3 transmit light from the two VCSELs 16_1, 16_2 back to the 1×2 planar optical coupler 33, which transmits said light back to the first planar optical waveguide OW1 and to the 2×1 optical coupler 31. The 2×1 optical coupler transmits said VCSEL light to the optical output 22.

At the two VCSELs 16_1, 16_2, the injection light may be received with a relative phase difference. Said phase difference may result, because the second and third optical waveguides OW2, OW3 having different optical path lengths, and/or because the 1×2 planar optical coupler 32''' transmits injection light to the second and third optical waveguides OW2, OW3 with a relative phase difference.

Similarly, propagation of mutually coherent laser light from the two VCSELs 16_1, 16_2 to the first planar optical waveguide typically introduces a relative phase difference to said mutually coherent VCSEL light. Said relative phase difference may result, because the second and third optical waveguides OW2, OW3 having different optical path lengths, and/or because the 1×2 planar optical coupler 33 transmits injection light to the second and third optical waveguides OW2, OW3 with a relative phase difference.

In some embodiments, the above-described relative phase differences may result from different lengths of the second and third optical waveguides OW2, OW3 and/or different effective refractive indices in segment(s) of the second and third optical waveguides OW2, OW3. Such different refractive indices may be produced by one or more electrical heaters (not shown), which maintain, e.g., the dielectric or semiconductor embodiments of the second and third optical waveguides OW2, OW3 at different temperatures. Alternatively, such different refractive indices may be produced by one or more electrode pair(s) (not show), which inject different charge carrier densities into semiconductor of the second and third optical waveguides OW2, OW3. In light of the present disclosure, a person of ordinary skill in the relevant arts would be able to readily construct and operate such electrical heater(s) or electrode pair(s) to adjust the relative phase differences produced on light propagating through the planar optical waveguides OW2, OW3.

The 1×2 planar optical coupler 33 combines the light from the two VCSELs 16_1, 16_2 so that said light has an effective fixed relative phase difference in the first optical waveguide OWE The effective fixed relative phase difference may be due to propagation of injection light from the master laser 12 and/or due to propagation of light from the VCSELs 16_1, 16_2 through portions of the planar optical waveguide coupler 30''', e.g., the second and third optical waveguides OW2, OW3 and the 1×2 planar optical coupler.

In some embodiments, the pair of VCSELs 16_1, 16_2 is push-pull operated, as described for the pair of VCSELs in FIG. 6. For such push-pull operation the effective fixed relative phase difference caused by the planar optical waveguide coupler may be , e.g., 180° up to a small angular error of ±5°, ±2° or even ±1°. In such embodiments, the VCSELs 16_1, 16_2 may also be driven by the electronic drivers 18_1, 18_2 with complementary voltages. Then, in the first optical waveguide OW1, the light from the pair of VCSELs 16_1, 16_2 will interfere in a manner that produces a combined optical carrier data modulated according to a BPSK constellation. For such an embodiment, the optical data modulator 10''' will transmit, at the optical output port 22, an optical carrier modulated with a digital data stream in a BPSK format.

FIG. 5 illustrates an I/Q embodiment 10'''' of the optical data modulator 10 of FIG. 1. The I/Q optical data modulator 10'''' can produce an optical carrier phase modulated according to the QPSK constellation or a QAM constellation. The optical data modulator 10'''' also includes a planar optical coupler 30'''' that combines the optical splitter 14 and optical combiner 20 of FIG. 1.

The planar optical coupler 30'''' includes a 2×2 planar optical coupler 35, and two copies 33-I, 33-Q of the 1×2 planar optical coupler 30''' of FIG. 4. Each 1×2 planar optical waveguide coupler 33-I, 33-Q couples to a corresponding I-pair or Q-pair of the VCSELs 16_1-16_4. The I-pair includes the VCSELs 16_1 and 16_2, and the Q-pair includes the remaining VCSELs 16_3 and 16_4. Each 1×2 planar optical coupler 33-I, 33-Q interferes light from the pair of corresponding VCSELs 16_1-16_4 with an "effective" relative phase difference, e.g., of about 180 degrees up to errors of ±5°, ±2°, or ±1° or less, as already described for the 1×2 planar optical coupler 33 and pair of VCSELs 16_1, 16_2 of FIG. 5 for push-pull operation. The VCSELs 16_1-16_4 of the I-pair and the Q-pair can be driven by the corresponding electronic drivers 18_1-18_4, for push-pull operation. Then, the two 1×2 planar optical waveguide couplers 33-I, 33-Q output to the 2×2 planar optical coupler 35 mutually coherent optical carriers independently data modulated according to the BPSK constellation.

Each 1×2 planar optical coupler 33-I, 33-Q also transmits injection light from the master laser 12 to the I-pair and Q-pair to lock the wavelengths of the four VCSELs 16_1-16_4 to the center wavelength of the master laser 12.

For the above push-pull embodiment, the 2×2 planar optical coupler 35 is typically configured to interfere the VCSEL light from the two 1×2 planar optical couplers 33-I, 33-Q with a fixed relative phase difference of about 90°, e.g., up to errors of ±5°, ±2°, or even ±1° or less. For such a configuration, the I-pair formed of the VCSELs 16_1-16_3 will produce an in-phase data modulated optical signal, and the Q-pair formed of the 16_3-16_4 will produce a mutually coherent quadrature-phase data modulated optical signal so that the optical output 22 outputs an optical signal carrying both in-phase and quadrature-phase data modulation, e.g., according to the QPSK or a QAM constellation.

In light of the above description, a person of ordinary skill in the relevant arts would be easily able to construct and operate embodiments of the I/Q optical modulator 10"" of FIG. 5 to produce optical carriers modulated according to the QAM constellations.

Figure 7:
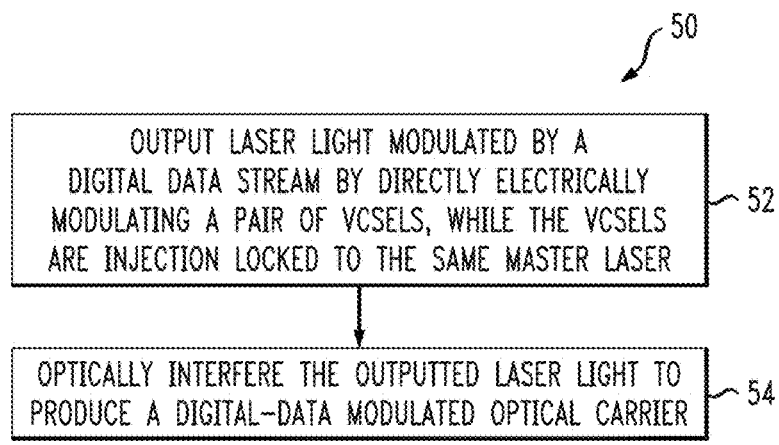
FIG. 7 is a flow chart illustrating a method of performing optical data modulation and transmission with an array of directly electrically modulated and injection locked VCSELs, e.g., for use in the optical data modulators of FIGS. 1-5.

FIG. 7 illustrates a method 50 of performing optical data transmission with an array of wavelength-locked VCSELs, e.g., for operating the optical data modulators 10, 10', 10", 10"', 10"" of FIGS. 1-5.

The method 50 includes outputting laser light modulated by a digital data stream by directly electrically modulating a pair of VCSELs, which are injection locked to the same master laser, with the digital data stream (step 52). For example, the directly electrically modulating may be performed on a pair of the VCSELs 16_1, 16_2, 16_N of FIGS. 1-5 by the electrical drivers 18_1, 18_2. The direct electrical modulation step 52 may be performed, e.g., in a push-pull configuration in some embodiments.

The method 50 also includes optically interfering the laser light outputted by the pair of VCSELs during the direct electrical modulation to produce a digital-data modulated optical carrier, e.g., the interference may be performed in the optical couplers 20, 30', 30", 33, 33-I, 33-Q of FIGS. 1-5 (step 54). The laser light output by the pair of VCSELs is mutually coherent, because the VCSELs are injection locked to the same master laser. The interfering may be performed on the light of the pair with a fixed nonzero relative phase shift. For example, the fixed phase shift and form of the direct electrical modulation may be configured to cause the interfered laser light to carry a substantially BPSK modulation as already described.

Figure 8:
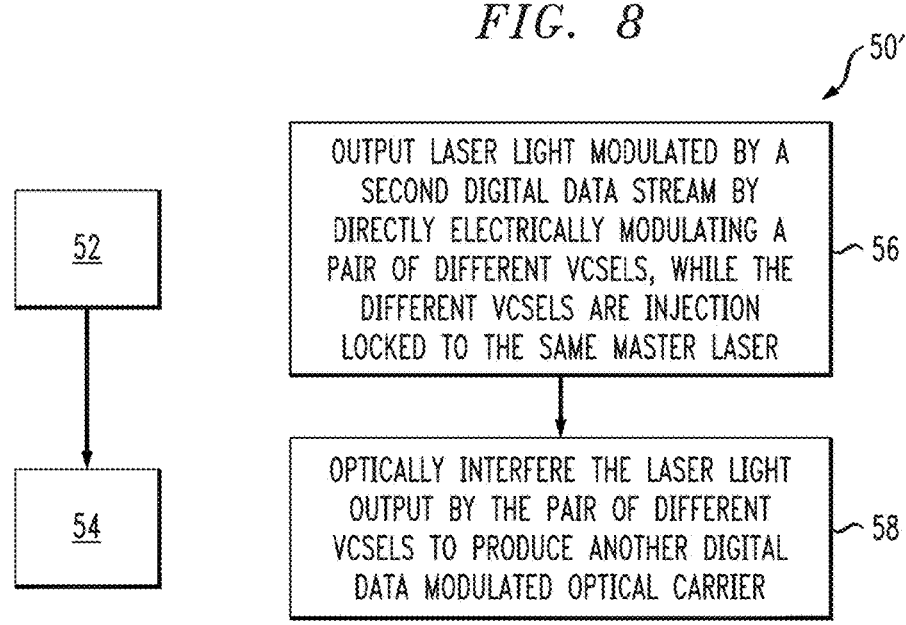
FIG. 8 is a flow chart illustrating a specific embodiment of the method of FIG. 7 that produces two optical carriers with phase modulation, e.g., for use in the optical data modulators of FIGS. 1, 3, and 5.

Referring to FIG. 8, an optional method 50' may also include the steps 52 and 54 of the method 50.

The method 50' further includes outputting laser light modulated by an independent second digital data stream by directly electrically modulating a pair of different VCSELs, which are injection locked to the same master laser, e.g., the master laser 12 and the VCSELs 16_3, 16_4, 16_N of FIGS. 1, 3, and 5 (step 56). For example, the directly electrically modulating may be performed on the VCSELs 16_3-16_4 of FIGS. 3 and 5 by the electronic drivers 18_3, 18_4. The direct electrical modulation step 56 may be performed, e.g., in a push-pull configuration in some embodiments.

The method 50' also includes optically interfering the second laser light outputted by the pair of different VCSELs during the direct electrical modulation to produce a second digital data modulated optical carrier (step 58). The laser output by the pair of different VCSELs is mutually coherent, because the different VCSELs are injection locked to the same master laser. The interfering may be performed on light output by the pair of different VCSELs, wherein the interfered light has an effective fixed relative phase shift. For example, the effective fixed phase shift and form of the direct electrical modulation may be configured to cause the interfered second laser light to carry another BPSK modulation.

Referring to FIG. 9, another optional method 50" may include the steps 52, 54, 56, and 58 of the method 50'.

The method 50" further includes interfering the light output by the first and second pairs of VCSELs to produce an optical carrier modulated by two independent digital data streams (step 50). For example, the light output by the first and second pairs may be interfered with an effective fixed relative phase shift of about ninety degrees to produce a substantially in-phase and quadrature-phase modulated optical carrier, e.g., according to a QPSK constellation or a QAM constellation.

From the disclosure, drawings, and claims, other embodiments of the invention will be apparent to those skilled in the art.

What is claimed is:

1. An apparatus, comprising:
    a plurality of vertical-cavity surface-emitting lasers;
    a master laser configured to transmit laser light to the vertical-cavity surface-emitting lasers to optically lock wavelengths of the vertical-cavity surface-emitting lasers;
    one or more electrical drivers connected to directly electrically modulate the vertical-cavity surface-emitting lasers in manner responsive to one or more digital data streams; and
    an optical combiner connected to combine light received from at least, a pair of the vertical-cavity surface-emitting lasers into an optical carrier with a substantially phase digital data modulation.

2. The apparatus of claim 1, wherein the one of the one or more electrical drivers is connected to operate the one pair of the vertical-cavity surface-emitting lasers in a push-pull configuration.

3. The apparatus of claim 2, wherein the optical combiner is connected to combine light received from a separate second pair of the vertical-cavity surface-emitting lasers into an optical carrier with a substantially phase digital data modulation.

4. The apparatus of claim 2, wherein another of the one or more electrical drivers is connected to operate a second pair of different ones of the vertical-cavity surface-emitting lasers in a push-pull configuration.

5. The apparatus of claim 3, wherein the one or more electrical drivers are configured to directly electrically modulate the vertical-cavity surface-emitting lasers such that the optical combiner combines light from the plurality of VCSELs into an optical carrier with in-phase and quadrature-phase digital data modulations.

6. The apparatus of claim 5, wherein the digital data modulations comprise modulations of an entire quadrature amplitude modulation constellation.

7. The apparatus of claim 1, wherein the optical combiner includes a free space optical device with a pixelated surface configured or configurable to split a light beam received from the master laser into multiple light beams.

8. The apparatus of claim 1, wherein the optical combiner includes an optical waveguide coupler configured to combine light from a first pair of the vertical-cavity surface-emitting lasers and a disjoint second pair of the vertical-cavity surface-emitting lasers with a relative phase shift.

9. A method, comprising:
    outputting laser light from a pair of directly electrically modulated vertical-cavity surface-emitting lasers while the vertical-cavity surface-emitting lasers are injection locked to a single master laser; and
    optically interfering the outputted laser light to produce an optical carrier having a phase data modulation.

10. The method of claim 9, wherein the directly electrically modulating of the vertical-cavity surface-emitting lasers is performed in a push-pull manner.

11. The method of claim 9, wherein the laser light outputted from the pair of vertical-cavity surface-emitting lasers is mutually coherent.

12. The method of claim 9, wherein the optically interfering produces the optical carrier with a substantially binary-phase-shift-keying modulation.

13. The method of claim 9, further comprising:
outputting second laser light from a pair of different directly electrically modulated vertical-cavity surface-emitting lasers while the different directly electrically modulated vertical-cavity surface-emitting lasers are injection locked to the single master laser; and
optically interfering the outputted second laser light to produce another optical carrier having a phase data modulation.

14. The method of claim 13, further comprising interfering the outputted laser light from the pairs to produce an optical carrier with in-phase and quadrature-phase data modulations.

15. The method of claim 14, wherein the interfering the outputted laser light produced by the pairs produces an optical carrier with a quadrature amplitude data modulation.

* * * * *